US005608350A

United States Patent [19]
Ebukuro

[11] Patent Number: 5,608,350
[45] Date of Patent: Mar. 4, 1997

[54] OPERATIONAL AMPLIFIER WITH CONTROL SEQUENCE CIRCUIT

[75] Inventor: Masahiro Ebukuro, Tokyo, Japan

[73] Assignee: NEC Corporation, Japan

[21] Appl. No.: 574,728

[22] Filed: Dec. 19, 1995

[30] Foreign Application Priority Data

Dec. 21, 1994 [JP] Japan .................................. 6-318398

[51] Int. Cl.⁶ ..................................................... H03F 3/45
[52] U.S. Cl. ............................ 330/51; 330/253; 330/255; 330/261
[58] Field of Search .............................. 330/51, 253, 255, 330/261

[56] References Cited

U.S. PATENT DOCUMENTS 4,379,267  4/1983  Young ................................ 330/255 X

FOREIGN PATENT DOCUMENTS 63-157513  6/1988  Japan ................................ H03F 3/45

*Primary Examiner*—James B. Mullins
*Attorney, Agent, or Firm*—Hayes, Soloway, Hennessey, Grossman & Hage, P.C.

[57] ABSTRACT

An operational amplifier includes a first output transistor connected between a higher potential power source terminal and an output terminal and a second output transistor connected between a lower potential power source terminal and the output terminal. The first and second output transistors are on/off controlled by a sequence control circuit according to a control signal. The sequence control circuit includes a first inverter which produces a first internal control signal for on/off controlling the first output transistor and a second inverter which produces a second internal control signal for on/off controlling the second output transistor. When the control signal changes from a high to a low level, the first internal control signal is inverted after the inversion of the second internal control signal. When the control signal changes from a low to a high level, the second internal control signal is inverted after the inversion of the first internal control signal. The transient voltage outputted from the output terminal when the operational amplifier changes from its active to inactive state becomes identical to that when the operational amplifier changes from its inactive to active state.

6 Claims, 5 Drawing Sheets

OPERATIONAL AMPLIFIER WITH CONTROL SEQUENCE CIRCUIT

BACKGROUND OF THE INVENTION (1) Field of the Invention

The present invention relates to an operational amplifier, and more particularly to an operational amplifier in which the operation thereof is stopped in response to a control signal and an output terminal thereof is rendered to a high impedance state.

(2) Description of the Related Art

The basic operation of the operational amplifier is to differentially amplify the signal inputted from an inversion input terminal and a non-inversion input terminal and to output the signal thus amplified to an output terminal. There is a prior art operational amplifier in which an additional control signal input terminal is provided and, by stopping the operation in response to the control signal inputted to the additional control signal input terminal, the power consumption is saved during the non-operation state. Such a prior art amplifier is proposed in Japanese Patent Application Kokai Publication No. Sho 63-157513. The circuit configuration and the operation of the proposed amplifier are hereinafter explained.

FIG. 1 shows a circuit diagram of the prior art operational amplifier constituted by CMOS transistors. In the drawings, the numeral 1 represents a control signal input terminal, 2 represents an inversion input terminal, 3 represents a non-inversion input terminal, and 4 represents an output terminal. This operational amplifier 4000 performs a normal operation (hereinafter referred to as an "active state") when a control signal (logical level) inputted to the control signal input terminal 1 is at the low level, and stops its operation (hereinafter referred to as an "inactive state") when the control signal inputted is at the high level. Thus, the explanation is made hereunder by dividing the operation into the two states, namely, one when the control signal is at the low level and the other when the same is at the high level.

First, when the control signal is at the low level, that is, the operational amplifier is in an active state, the N-channel MOS transistor (hereinafter referred to as "N-MOS") 18 turns ON and the N-MOS 19 turns OFF, so that a current flows to a bias section which is formed by a diode connected P-channel MOS transistor (hereinafter referred to as "P-MOS") 17 and an N-MOS 20, and accordingly the bias voltage is supplied to the gates of N-MOSs 21 and 27. Consequently, a constant current is supplied to a differential amplifier constituted by P-MOSs 22 and 23 and N-MOSs 21, 24 and 25, and a voltage which corresponds to the levels of the input signals supplied to the inversion input terminal 2 and the non-inversion input terminal 3 appears at a node 53. On the other hand, since a P-MOS 28 and an N-MOS 34 turn OFF and a P-MOS 32 is ON, a signal which corresponds to the voltage level at the node 53 is outputted from the output terminal 4 through a first output circuit constituted by a P-MOS 26 and an N-MOS 27, a second output circuit constituted by a P-MOS 29 and an N-MOS 30, a third output circuit constituted by a P-MOS 31 and an N-MOS 33, a fourth output circuit constituted by a P-MOS 35 and an N-MOS 36, and a fifth output circuit constituted by a P-MOS 37 and an N-MOS 38. Here, if the potential at the inversion input terminal 2 is lower than that at the non-inversion input terminal 3, the output terminal 4 is coupled to the power source terminal 5 through the P-MOS 37 and, if the potential at the inversion input terminal 2 is higher than that at the non-inversion input terminal 3, the output terminal 4 is coupled to the ground terminal 6 through the N-MOS 38. However, under the normal use state, a negative feedback circuit is often formed between the output terminal 4 and the inversion input terminal 2 so that, at the output terminal 4, there appears a voltage corresponding to levels of the signals supplied to the inversion input terminal 2 and the non-inversion input terminal 3 without the output terminal 4 being saturated to the power source potential or the ground potential.

Next, the operation in the case where the logical level of the control signal is at the high level, that is, in an inactive state, is explained. When the control signal is at the high level, the N-MOS 34 is ON so that the node 51 is grounded. Consequently, the P-MOS 35 turns ON and the P-MOS 37 turns OFF. That is, the output terminal 4 is electrically separated from the power source terminal 5. Also, since the P-MOS 28 becomes ON, the node 49 turns to the power source potential so that the N-MOS 30 becomes ON and the N-MOS 38 becomes OFF. That is, the output terminal 4 is also electrically separated from the ground terminal 6. In this way, the P-MOS 37 and the N-MOS 38 which constitute the fifth output circuit are both OFF so that the output terminal 4 turns to a high impedance state. At this time, since the node 50 is grounded, the P-MOS 31 is turned ON. However, since the P-MOS 32 is turned OFF, there is no possibility for the through-current to flow from the power source terminal 5 to the ground terminal 6 via the P-MOS 31 and the N-MOS 34. On the other hand, the bias section stops its operation because the node 48 is grounded as the N-MOS 19 is ON. Consequently, the N-MOSs 21 and 27 do not allow the current to flow no matter what signals are supplied to the inversion input terminal 2 and the non-inversion input terminal 3 and, since the N-MOS 18 becomes OFF, the bias section turns to a complete cut-off state. In this way, in the inactive state, irrespective of the levels of the signals supplied to the inversion input terminal 2 and the non-inversion input terminal 3, the output terminal 4 turns to a high impedance state, so that it is electrically separated from the next stage circuit connected thereto, and all the current paths from the power source terminal 5 to the ground terminal 6 are cut-off, whereby the power consumption is rendered to almost zero.

Next, with reference to a timing chart of FIG. 2, explanation is made on the operation of the operational amplifier 4000 before and after the change to take place in the control signal supplied to the control signal input terminal 1. First, when the control signal is at the low level (time period T10), that is, in an active state, the nodes 49 and 51 and the output terminal 4 are of the potential corresponding to the levels of the input signals supplied to the inversion input terminal 2 and the non-inversion input terminal 3. Subsequently, at the timing t13, when the control signal supplied to the control signal input terminal 1 changes to the high level, the internal control signals 201 and 202 are inverted accordingly. However, since the internal control signal 202 is a signal having passed through the inverter 200, the time when this is inverted is delayed from the time when the internal control signal 201 is inverted as shown in FIG. 2. As a consequence, the node 51 is grounded before the node 49 rises to the power source potential so that, between the P-MOS 37 and the N-MOS 38, it is the P-MOS 37 that turns OFF first. At this time, the N-MOS 38 is still conductive in accordance with the level of the input signal so that the output terminal 4 turns to a high impedance state after the potential thereat having once fallen to the ground potential. Then, while the control signal is at the high level (inactive state), the state of high impedance continues (time period T11). When the control signal again changes to the low level at the timing t14, the internal control signals 201 and 202 are inverted, but the time when the internal control signal 202 is inverted is delayed because of the presence of the inverter 200 as explained above. As a consequence, while the node 49 remains at the power source potential, that is, the P-MOS 31 is remaining as being ON, the N-MOS 32 first turns ON and, moreover, since the N-MOS 34 turns OFF, the potential at the node 51 rises to the power source potential. Consequently, the potential at the node 52 becomes the ground potential and the P-MOS 37 turns ON accordingly, but the N-MOS 38 is still OFF. That is, at the timing t14, irrespective of the levels of the input signals, the P-MOS 37 turns ON while the N-MOS 38 is still in the OFF state. Thus, as shown in FIG. 2, the potential at the output terminal 4 once rises to the power source potential. Subsequently, the P-MOS 28 turns OFF and, since the potential at the node 49 becomes a potential that corresponds to the input signal, the potential at the output terminal 4 becomes a potential that corresponds to the input signal accordingly.

The conventional operational amplifier explained above operates such that the potential at the output terminal 4 once falls to the ground potential when the change takes place from the active state to the inactive state in accordance with the change of the control signal supplied to the control signal input terminal 1 and, inversely, once rises to the power source potential when the change takes place from the inactive state to the active state. Thus, irrespective of the levels of the input signals supplied to the inversion input terminal 2 and the non-inversion input terminal 3, the next stage circuit connected to the output terminal 4 receives the low level signal every time the operational amplifier 4000 turns to the inactive state and receives a high level signal every time the operational amplifier 4000 turns to the active state. This can be a cause for the occurrence of malfunctions in the next stage circuit.

For the above reason, it is necessary that the next stage circuit be constructed so as to avoid the occurrence of malfunctions caused by changes in the output signals from the operational amplifier. However, in the conventional operational amplifier 4000, the signal transiently outputted from the output terminal 4 when the state changes to the inactive state and that transiently outputted when the state changes to the active state are different from each other as explained above. That is, when the change is to the inactive state, the output terminal 4 outputs a low level signal and, when the change is to the active state, the output terminal 4 outputs a high level signal. Thus, the next stage circuit that receives the above signals must be provided with some additional means in order to ensure the avoidance of the malfunctioning.

The problem in the above conventional amplifier circuit is that, when the changes takes place from the inactive state to the active state, the potential of the output terminal 4 at the timing t14 in FIG. 2 once changes from the ground potential to the power source potential followed by a change to the potential (potential "A") that corresponds to levels of the input signals supplied to the inversion input terminal 2 and the non-inversion input terminal 3. Thus, in the next stage circuit, the inputs are in the sequence of 1) ground potential, 2) power source potential, and 3) potential "A". An example of the specific means that may be additionally employed in order to avoid the above problem is an analog switch which may be provided between the output terminal 4 and an input terminal of the next stage circuit of the conventional circuit so that the portion of the above change to the potential "A" has not effect on the operation.

On the other hand, according to the present invention, whether the change is from the active state to the inactive state or from the inactive state to the active state, the change is only between the potential "A" and the ground potential, and this makes the operation of the circuit according to the present invention distinctly different from that in the prior art.

SUMMARY OF THE INVENTION

An object of the invention, therefore, is to overcome the problems existing in the prior art, and to provide an improved operational amplifier in which the signals transiently outputted from an output terminal are of the same potential both when an active state changes to an inactive state and when an inactive state changes to an active state.

According to the invention, the operational amplifier is provided with a control sequence section which controls the levels of the signals outputted from the output terminal when the change takes place from the active state to the inactive state and from the inactive state to the active state in accordance with levels of the control signal inputted from the control input terminal.

According to one aspect of the invention, there is provided an operational amplifier wherein input signals applied between inversion and non-inversion input terminals are differentially amplified and an output signal is outputted at an output terminal when a control signal applied to a control signal input terminal is at a first logical level and the output terminal is made to be in a high impedance state when the control signal is at a second logical level, the operational amplifier comprising:

a differential amplifier circuit having the inversion and non-inversion input terminals, for differentially amplifying the input signals and producing an internal differential signal;

a bias circuit for supplying a current to the differential amplifier;

an output circuit for procuring therein a first and a second internal output signal based on the internal differential signal, the output circuit including an output P-MOS transistor having a gate receiving the first internal output signal, a source connected to a power source terminal and a drain connected to the output terminal, and an output N-MOS transistor having a gate receiving the second internal output signal, a drain connected to the output terminal and a source grounded; and a sequence control circuit including a first and a second inverting means for respectively producing, based on the control signal inputted to the control signal input terminal, a first internal control signal for on/off controlling the output P-MOS transistor and a second internal control signal for on/off controlling the output N-MOS transistor, the second internal control signal being inverted after the first internal control signal is inverted when the control signal changes from the first logical level to the second logical level, and the first internal control signal being inverted after the second control signal is inverted when the control signal changes from the second logical level to the first logical level.

In the operational amplifier according to the invention, since the signals transiently outputted from the output terminal are of the same potential, the circuit connected at the next stage is unlikely to malfunction, and even in the case where the next stage circuit is so constructed as to further ensure the avoidance of the malfunction to be caused by the signal of the ground potential outputted when the change takes place, the next stage circuit does not require any specially complex circuitry.

Also, in the operational amplifier according to the invention, when the change takes place both from the active state to the inactive state and from the inactive state to the active state, there is no flow of the through-current thus effectively reducing the power consumption.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanying drawings.

Figure 1:
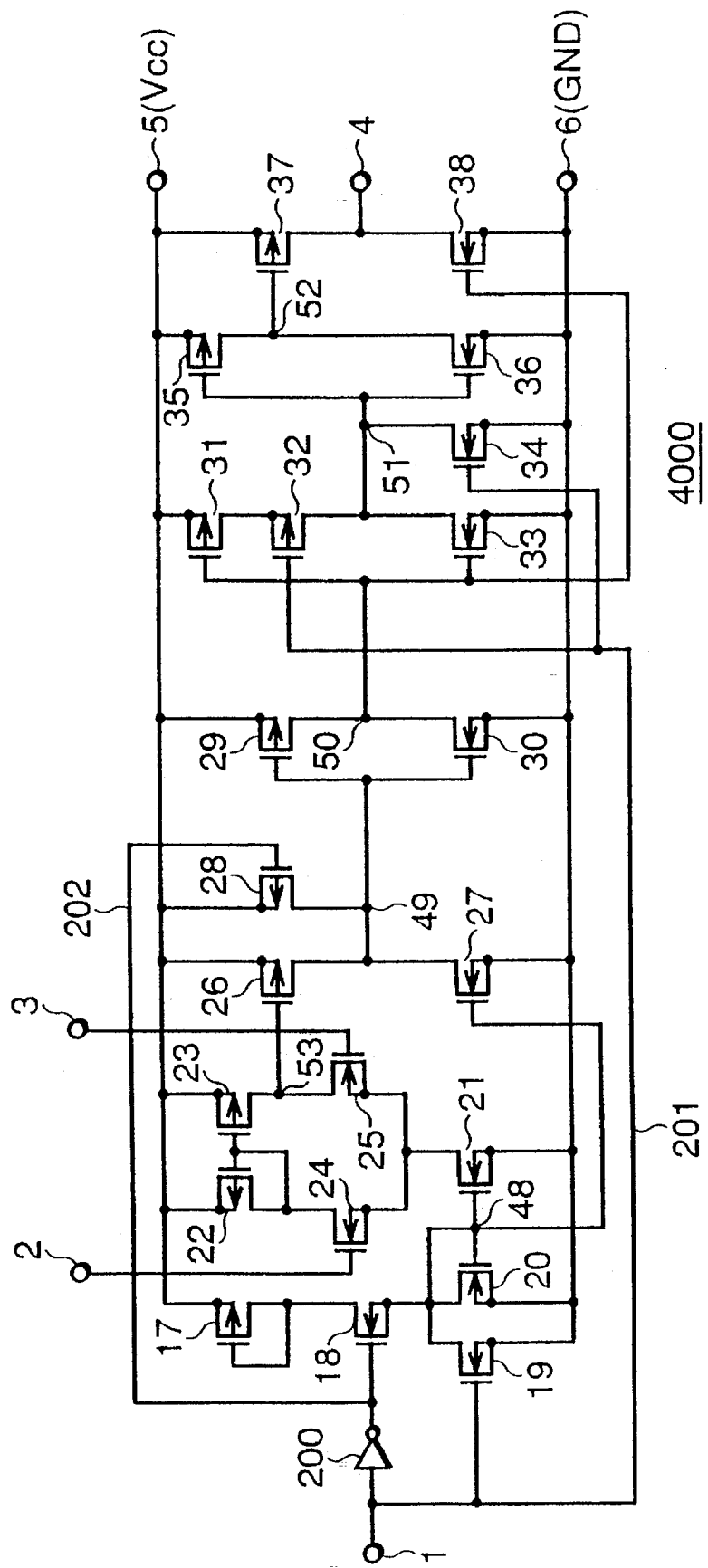
FIG. 1 is a circuit diagram of the prior art operational amplifier.
Figure 2:
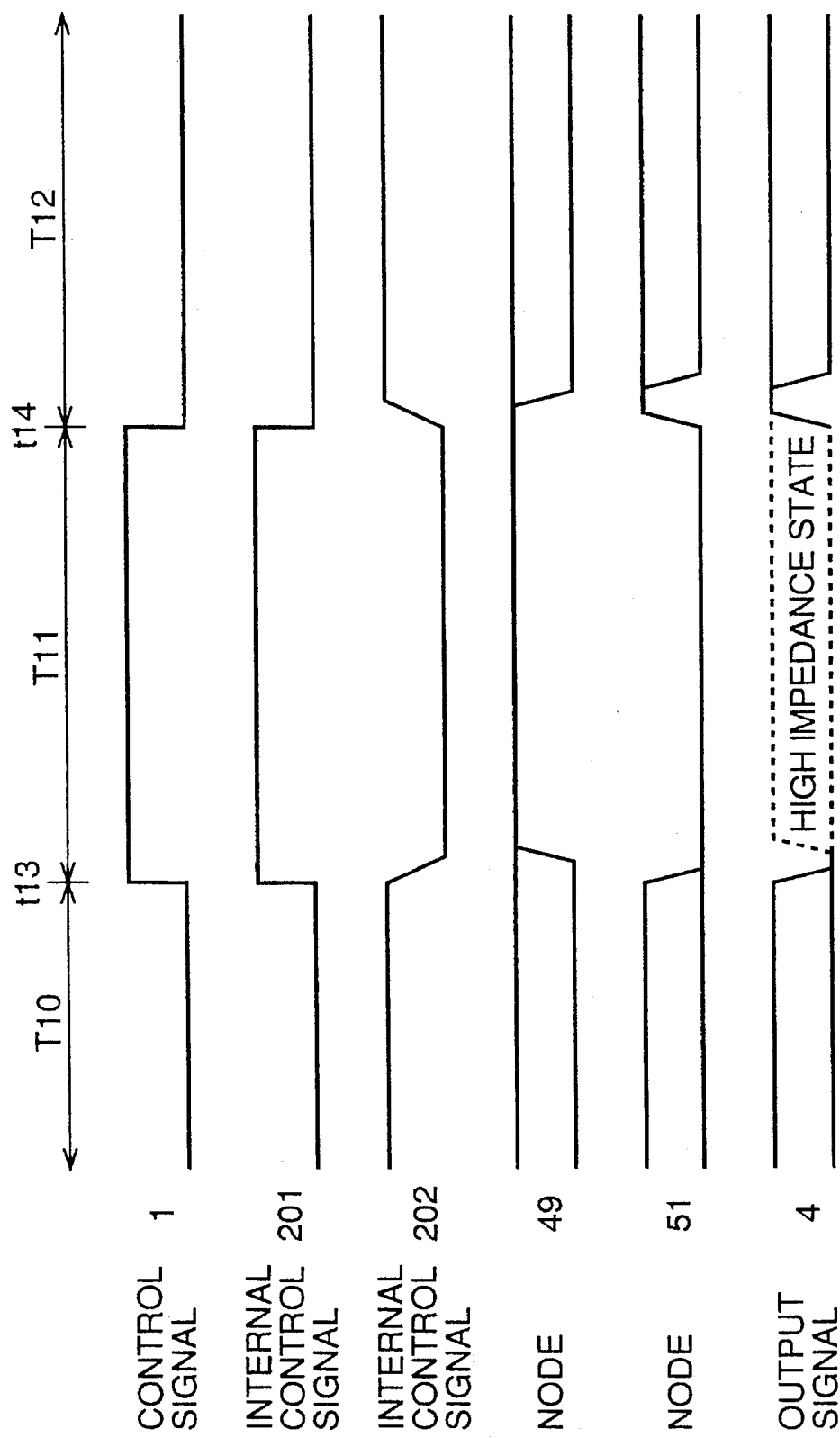
FIG. 2 is a timing chart for explaining the operation of the operational amplifier shown in FIG. 1.
Figure 3:
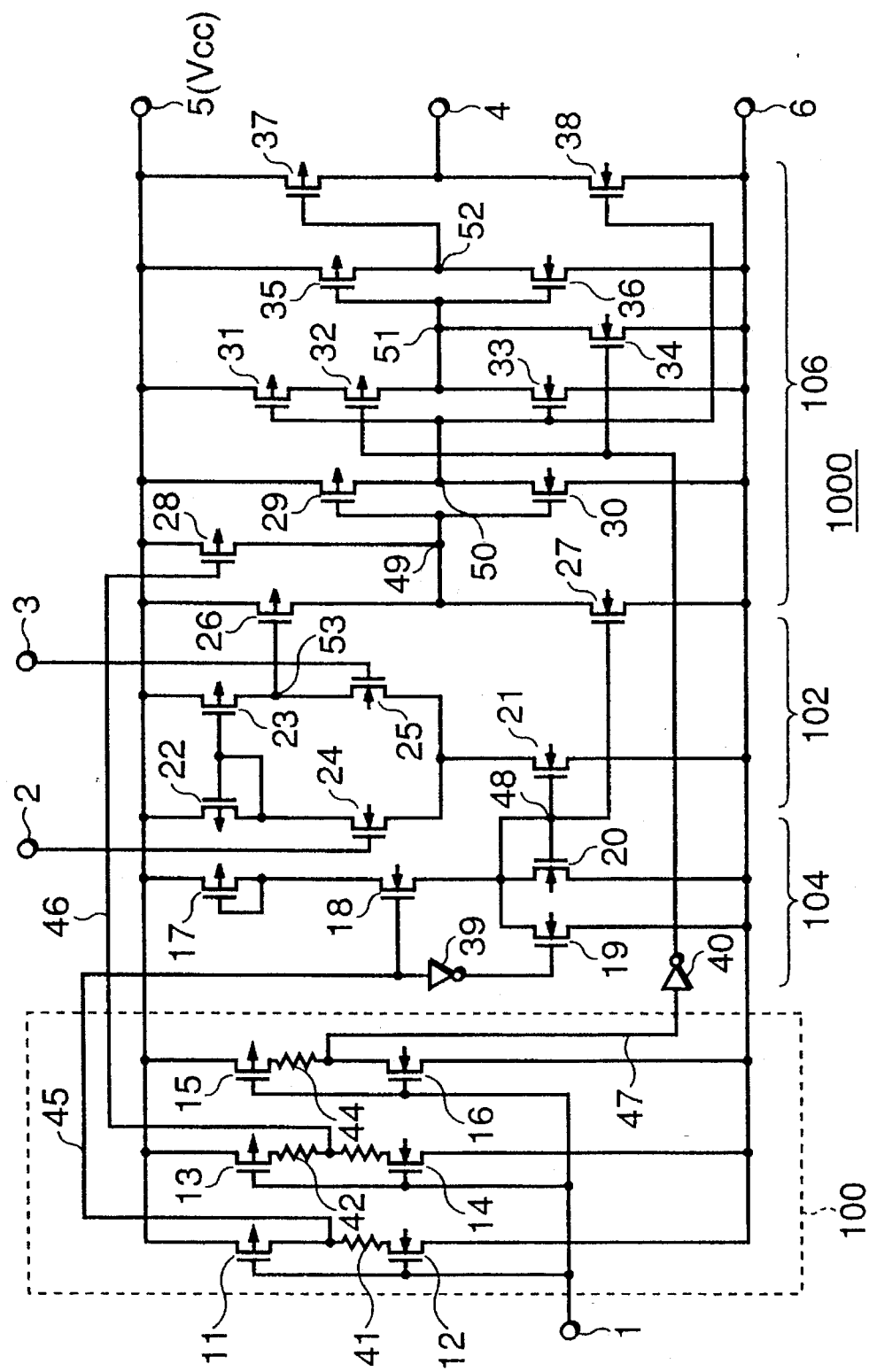
FIG. 3 is a circuit diagram of the operational amplifier of the first embodiment according to the invention.

FIG. 3 shows a circuit diagram of an operational amplifier 1000 of a first embodiment according to the invention. The same reference numerals and symbols are used for the same or similar elements used in explaining the conventional operational amplifier 4000 shown in FIG. 1. In this embodiment, a control sequence section 100 is added to the conventional operational amplifier 4000. The control sequence section 100 controls the sequence of changes in the internal control signals which take place when the operational amplifier 4000 undergoes a change from an active state to an inactive state and vise versa and, consequently, both when the operational amplifier 1000 undergoes a change from the active state to the inactive state and when the same undergoes a change from the inactive state to the active state, the signals transiently outputted from the output terminal 4 are rendered to be the same potential.

As shown in FIG. 3, the control sequence section 100 consists of three inverters whose inputs are commonly connected to a control signal input terminal 1. In the following explanation, an inverter consisting of a P-MOS 11, an N-MOS 12 and a resistor 41 is called "a first sequence section"; an inverter consisting of a P-MOS 13, an N-MOS 14 and two resistors 42 and 43 is called "a second sequence section"; and an inverter consisting of a P-MOS 15, an N-MOS 16 and a resistor 44 is called "a third sequence section". As seen in the drawings, the first sequence section outputs an internal control signal 45, the second sequence section outputs an internal control signal 46, and the third sequence section outputs an internal control signal 47. The internal control signal 45 is supplied to the N-MOS 18 and the inverter 39, the internal control signal 46 is supplied to the P-MOS 28, and the internal control signal 47 is supplied to the P-MOS 32 and the N-MOS 34 through the inverter 40.

In this way, as explained hereunder in detail, the first sequence section controls the bias section, the second sequence section indirectly controls the N-MOS 38, and the third sequence section indirectly controls the P-MOS 37. Also, the operational amplifier 1000 of this embodiment performs the normal operation (active state) when the control signal inputted to the control signal input terminal 1 is at the low level, and stops its operation (inactive state) when the same is at the high level. Thus, the operation is hereinafter explained by dividing it into that at the high level and that at the low level of the control signal.

First, when the control signal is at the low level, that is, in an active state, the internal control signals 45, 46 and 47 are all at the high level. Consequently, the N-MOS 18 is ON and the N-MOS 19 is OFF so that the current flows to the bias section 104 constituted by the diode connected P-MOS 17 and the N-MOS 20 and the bias voltage is supplied to the gates of the N-MOSs 21 and 27. Thus, the constant current is supplied to the differential amplifier 102 constituted by the P-MOSs 22, 23 and the N-MOSs 21, 24, 25 and, at the node 53, there appears the voltage (internal differential signal) corresponding to levels of the input signals supplied to the inversion input terminal 2 and the non-inversion input terminal 3. Also, since the P-MOS 28 and the N-MOS 34 are OFF whereas the P-MOS 32 is ON, the output terminal 4 outputs the signal which corresponds to a voltage level of the node 53 through the first output circuit constituted by a P-MOS 26 and an N-MOS 27, the second output circuit constituted by a P-MOS 29 and an N-MOS 30, the third output circuit constituted by a P-MOS 31 and an N-MOS 33, the fourth output circuit constituted by a P-MOS 35 and an N-MOS 36, and the fifth output circuit constituted by a P-MOS 37 and an N-MOS 38. The first to fifth output circuits constitute an output section 106. Thus, when the potential at the inversion input terminal 2 is lower than the potential at the non-inversion input terminal 3, the output terminal 4 is coupled to the power source terminal 5 through the P-MOS 37 and, when the potential at the inversion input terminal 2 is higher than that of the non-inversion input terminal 3, the output terminal 4 is coupled to the ground terminal 6 through the N-MOS 38. However, under the normal use state, a negative feedback circuit is often connected between the output terminal 4 and the inversion input terminal 2 so that, at the output terminal 4, there appears a voltage corresponding to the levels of signals supplied to the inversion input terminal 2 and the non-inversion input terminal 3 without the output terminal 4 being saturated to the power source potential or the ground potential.

When the control signal is at the high level, that is, in an inactive state, the control signals 45, 46 and 47 are all at the low level. Consequently, the N-MOS 18 turns OFF and the N-MOS 19 turns ON so that the current flowing to the bias section is cut-off and the node 48 is grounded. Thus, no current flows to the differential amplifier and the first output circuit which is formed by the P-MOS 26 and the N-MOS 27. Further, since the N-MOS 34 turns ON, the P-MOS 37 turns OFF so that the output terminal 4 is electrically separated from the power source terminal 5 and, since the P-MOS 28 turns ON, the N-MOS 38 turns OFF so that the output terminal 4 is also electrically separated from the ground terminal 6. In this way, the P-MOS 37 and the N-MOS 38 which constitute the fifth output circuit are both OFF so that the output terminal 4 turns to a high impedance state. At this time, since the node 50 is grounded, the P-MOS 31 is ON. However, since the P-MOS 32 is OFF, there is no possibility for the through-current to flow from the power source terminal 5 to the ground terminal 6 via the P-MOS 31 and the N-MOS 34. In this way, in the inactive state, irrespective of the levels of the signals supplied to the inversion input terminal 2 and the non-inversion input terminal 3, the output terminal 4 turns to a high impedance state, so that it is electrically separated from the circuit to be connected at the next stage, and all the current paths from the power source terminal 5 to the ground terminal 6 are cut-off whereby the power consumption is rendered to almost zero.

Figure 4:
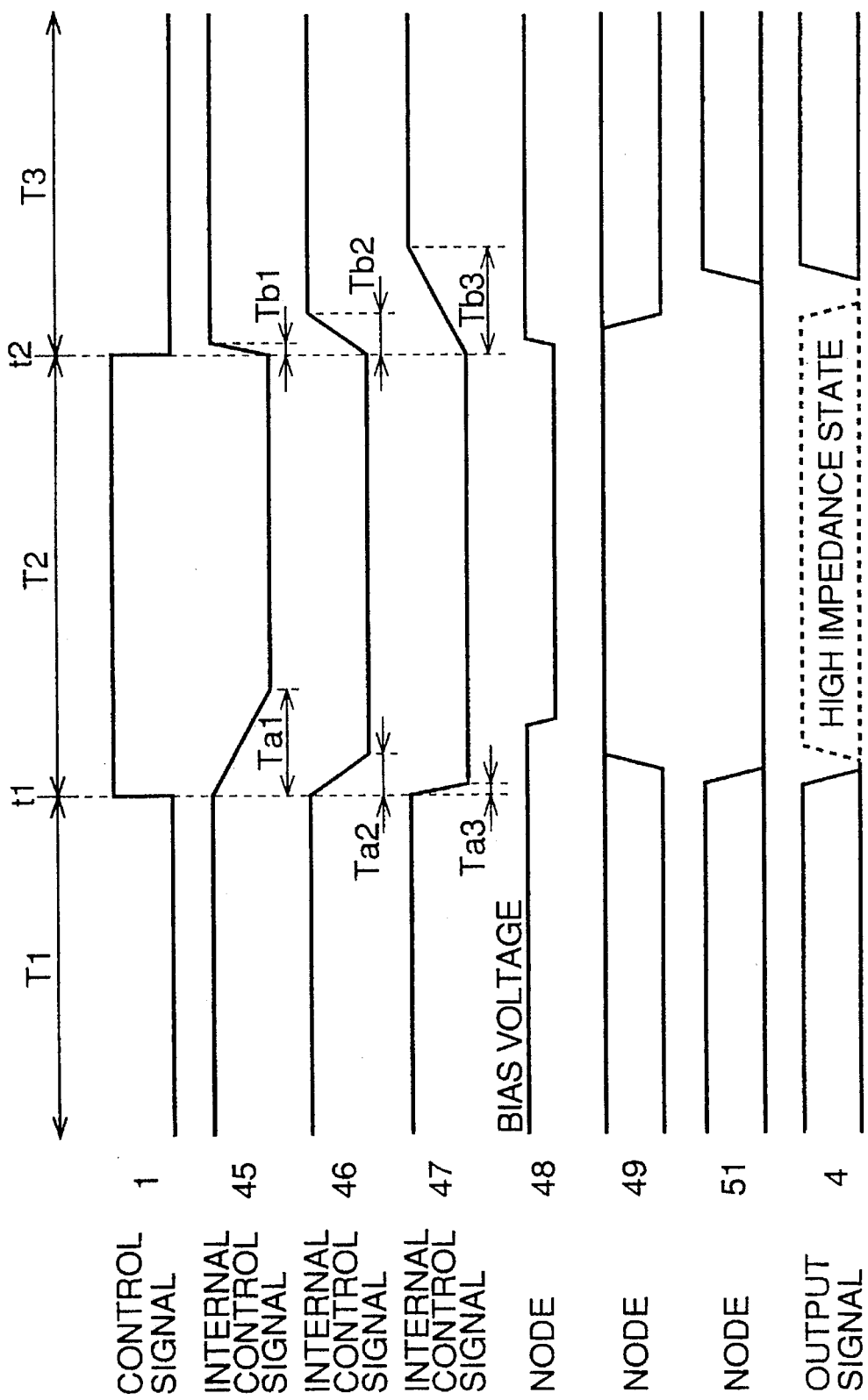
FIG. 4 is a timing chart for explaining the operation of the operational amplifier shown in FIG. 3.

Now, the actual operation of the operational amplifier 1000 before and after the change in the control signal is explained with reference to the timing chart shown in FIG. 4, but before doing so, the first, second and third sequence sections which are the features of the invention are explained.

As shown in FIG. 3, in the first sequence section, the resistor 41 is connected between the drain of the P-MOS 11 and the drain of the N-MOS 12, and the internal control signal 45 is derived from the connection between the resistor 41 and the drain of the P-MOS 11. Thus, when the control signal supplied to the control input terminal 1 changes from its high to low level, the internal control signal 45 is quickly inverted to the high level. However, when the change takes place from the low level to the high level, the internal control signal 45 is inverted to the low level in accordance with a time constant determined by a resistance value of the resistor 41 and the input capacitance of the N-MOS 18 and the inverter 39 and the wiring capacitance. Also, in the second sequence section, series connected resistors 42 and 43 are connected between the drain of the P-MOS 13 and the drain of the N-MOS 14, and the internal control signal 46 is derived from the connection between the resistors 42 and 43. Thus, when inverted to the high level, the internal control signal 46 is inverted in accordance with a time constant determined by a resistance value of the resistor 42 and input capacitance of the P-MOS 28 and the wiring capacitance. When inverted to the low level, the internal control signal 46 is inverted to the low level in accordance with the time constant determined by a resistance value of the resistor 43 and input capacitance of the P-MOS 28 and the wiring capacitance. In the third sequence section, the resistor 44 is connected between the drain of the P-MOS 15 and the drain of the N-MOS 16, and the internal control signal 47 is derived from the connection between the resistor 44 and the drain of the N-MOS 16. Thus, when inverted to the low level, the internal control signal 47 is quickly inverted. When inverted to the high level, the internal control signal 47 is inverted in accordance with a time constant determined by a resistance value of the resistor 44 and input capacitance of inverter 40 and the wiring capacitance. Therefore, in all of the first, second and third sequence sections, it is possible, by the setting of the resistance values, to freely set desired inversion speeds respectively for the inversion from the high level to the low level and from the low level to the high level.

Now, the actual operation of the operational amplifier 1000 before and after the change in the control signal is explained. As shown in FIG. 4, when the control signal is at the low level (time period T1), that is, in an active state, the nodes 49 and 51 and the output terminal 4 are of the potentials according to the levels of the input signals supplied to the inversion input terminal 2 and the non-inversion input terminal 3. Also, the bias voltage appears at the node 48. Subsequently, at the timing t1, when the control signal supplied to the control signal input terminal 1 changes, the internal control signals 45, 46 and 47 are inverted to low levels accordingly. However, as explained above, the speeds with which these internal control signals 45, 46 and 47 are inverted can be set as desired by the setting of the resistance values of the resistors concerned so that, when the resistance values of the resistors 41 and 43 are set such that the time periods in which the internal control signals 45, 46 and 47 are inverted from high levels to low levels are respectively $Ta1$, $Ta2$ and $Ta3$ with their relation being $Ta1>Ta2>Ta3$, the changes to the low level take place in the sequence of the internal control signals 47, 46 and 45. Here, if the inversion speeds of the inverters 39 and 40 are set so as to be sufficiently faster than the inversion speeds of the first, second and third sequence sections, first the P-MOS 32 turns OFF and then the N-MOS 36 turns ON. Consequently, as the node 51 is grounded and the node 52 turns to the high level, the P-MOS 37 turns OFF. However, at this moment, since the internal control signals 45 and 46 have not completely been inverted to the low level, there appears at the node 50 a voltage which corresponds to the levels of the input signals inputted to the inversion input terminal 2 and the non-inversion input terminal 3. That is, at this moment, the N-MOS 38 is still conducting depending on the level of the input signal so that the potential at the output terminal 4 falls to the ground potential. Subsequently, the internal control signal 46 is inverted to the low level and, thus, the P-MOS 28 is turned ON and the N-MOS 38 is turned OFF. Thus, the output terminal 4 turns to a high impedance state. Further, when the internal control signal 45 becomes the low level, the bias section stops the operation and, while the control signal supplied to the control signal input terminal 1 is at the high level (time period T2), this state continues. Subsequently, when the control signal again changes to the low level at the timing t2, the internal control signals 45, 46 and 47 are inverted to the high level. However, as already explained, the speeds with which these internal control signals 45, 46 and 47 are inverted can be set as desired by the setting of the respective resistance values so that, when the resistance values of the resistors 42 and 44 are set such that the time periods in which the internal control signals 45, 46 and 47 are inverted from high levels to low levels are respectively $Tb1$, $Tb2$ and $Tb3$ with their relation being $Tb1<Tb2<Tb3$, the changes to the low level take place in the sequence of the internal control signals 45, 46 and 47. Therefore, the current first flows to the bias section whereby the current flows to the differential amplifier. Thus, the potential at the node 53 becomes a potential that corresponds to the levels of the input signals. Next, the internal control signal 46 is inverted to the high level and the P-MOS 28 turns OFF. However, at this moment, there has already appeared at the node 53 a potential which corresponds to the levels of the input signals, the potential at the node 49 becomes also a potential that corresponds to the input signals. Consequently, the N-MOS 38 is conducting in dependence on the levels of the input signals and, at this moment, the internal control signal 47 is still at the high level and the P-MOS 37 is in an OFF state, so that the output terminal 4 changes from the high impedance state to the ground potential state. Subsequently, the internal control signal 47 turns to the high level and the potentials at the nodes 51 and 52 become potentials those correspond to the levels of the input signals and accordingly the P-MOS 37 becomes conductive and, thus, the level of the output from the output terminal 4 becomes a level corresponding to the levels of the input signals.

In the operational amplifier 1000 of this embodiment, because the control sequence section 100 is provided, both when the change is from an active state to an inactive state and when the change is from an inactive state to an active state, the potential at the output terminal falls to the ground potential, the likelihood of the occurrence of malfunctions at the next stage circuit is small and, even when the next stage circuit is to be constructed so as to ensure the avoidance of malfunctions caused by a signal of the ground potential outputted when the above change takes place, the next stage circuit can easily accommodate the means to make such avoidance without complicating the circuit, and this is because the potentials are the same during both the transient to the inactive state and the transient to the active state.

Further, in the inactive state, it is only sufficient for the output terminal to be put in a high impedance state and, where there is no necessity to reduce the power consumption by stopping the operation of the bias section, the first sequence section may well be omitted.

Next, a second embodiment of the invention is explained with reference to the drawings, especially, to FIG. 5.

Figure 5:
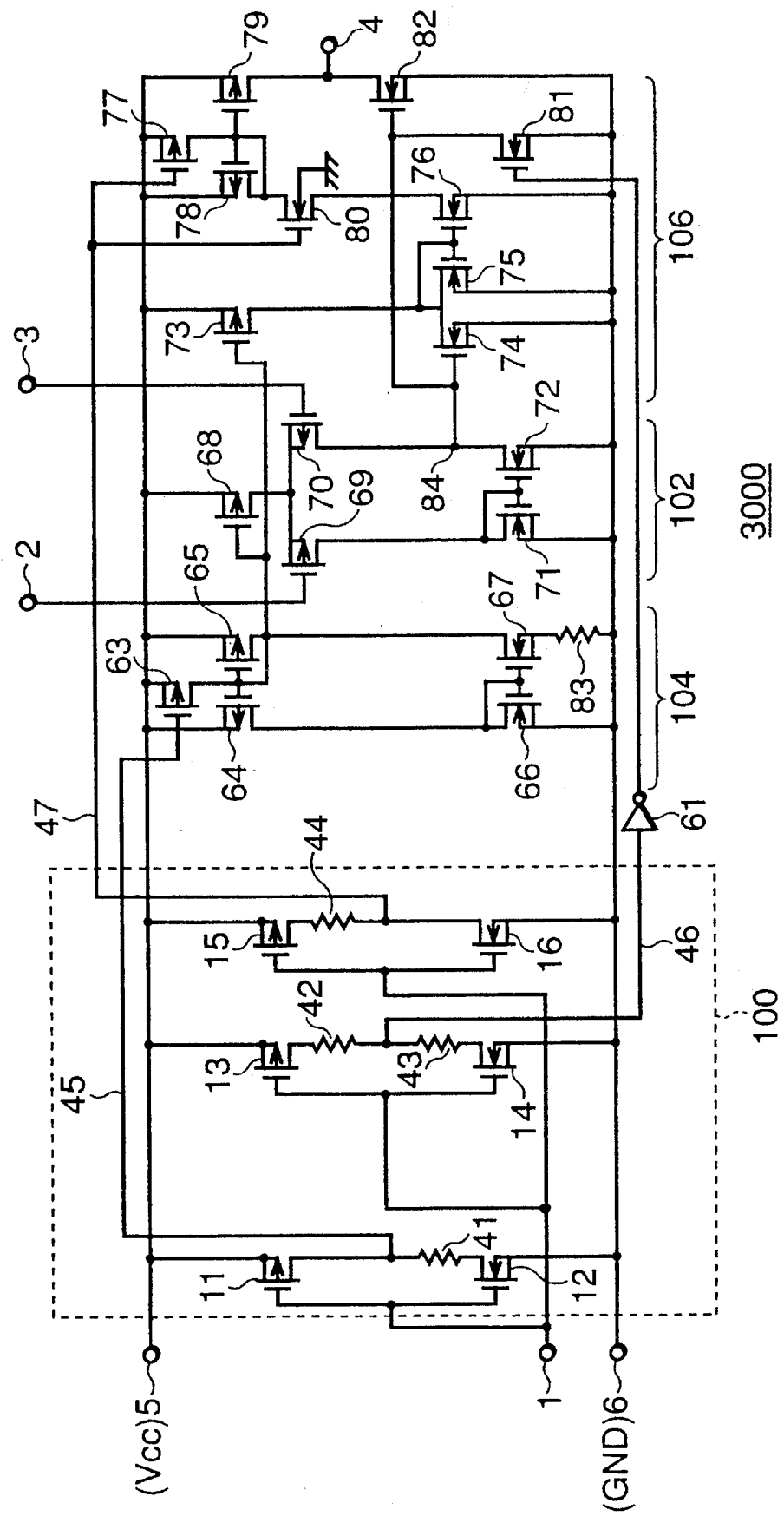
FIG. 5 is a circuit diagram of the operational amplifier of the second embodiment according to the invention.

FIG. 5 is a circuit diagram of an operational amplifier of the second embodiment. In the explanation, the same reference numerals and symbols are used for the same or similar elements used in explaining the conventional operational amplifier 4000 in FIG. 1 or the operational amplifier 1000 of the first embodiment in FIG. 3. In this differential amplifier 3000 of the second embodiment, as compared with the operational amplifier 1000 of the first embodiment, the number of transistors constituting the circuit from the differential amplifier up to the output terminal is reduced, and also the current path before and after the changes in the levels of the control signal supplied to the control signal input terminal is eliminated for further enhancing the reduction of power consumption.

That is, in the above operational amplifier 1000 of the first embodiment, when the change takes place from the inactive state to the active state, turning-ON of the N-MOS 18 is earlier than the turning-OFF of the N-MOS 19 because of the presence of the inverter 39 so that, in the state in which the N-MOS 19 remains ON, the N-MOS 18 becomes ON and conductive. Thus, every time the change takes place from the inactive state to the active state, the through-current flows to the bias section. Conversely, in the conventional operational amplifier 4000, every time the change takes place from the active state to the inactive state, the bias current unavoidably flows to the bias section. The operational amplifier 3000 of this second embodiment has solved the problem just explained. The circuit configuration and the operation thereof are explained below.

In the operational amplifier 3000 of this second embodiment, as in the operational amplifier 1000, there is provided a control signal input terminal 1 addition to the inversion input terminal 2 and the non-inversion input terminal 3 and, when the control signal supplied to the control signal input terminal 1 is at the low level, the output terminal 4 outputs an output signal whose level corresponds to the levels of the input signals supplied to the inversion input terminal 2 and the non-inversion input terminal 3 whereas, when the same is at the high level, the output terminal 4 is caused to be in a high impedance state irrespective of the levels of the input signals. Thus, the operation is hereinafter explained by dividing it into that at the high level and that at the low level.

First, during the active state, the internal control signals 45, 46 and 47 are all at the high level, the P-MOSs 63 and 77 and N-MOS 81 are OFF and the N-MOS 80 is ON, a current flows to the bias section constituted by the P-MOSs 64 and 65 and N-MOSs 66 and 67 and the resistor 83, and the bias voltage is supplied to the gates of the P-MOSs 68 and 73. Consequently, a constant current is supplied to the differential amplifier constituted by the P-MOSs 68, 69, 70 and the N-MOSs 71 and 72 so that, at the node 84, the voltage corresponding to the levels of the input signals supplied to the inversion input terminal 2 and the non-inversion input terminal 3 appears. This voltage is supplied to both the gate of the N-MOS 82 and the gate of the N-MOS 74. The current thus supplied to the N-MOS 74 has been supplied from the P-MOS 73 functioning as the constant current source and, since the current from the P-MOS 73 is also being supplied to the N-MOS 75, the current that flows to the N-MOS 75 becomes small when the current that flows to the N-MOS 74 becomes large. Thus, when the current that flows to the N-MOS 74 becomes small, the current that flows to the N-MOS 75 becomes large. The N-MOSs 75 and 76 and the P-MOSs 78 and 79 respectively constitute the current mirror circuits so that the current corresponding to the current flowing to the N-MOS 76 flows to the P-MOS 79. In this way, the output level of the output terminal 4 becomes the level corresponding the input signals supplied to the inversion input terminal 2 and the non-inversion input terminal 3.

Next, during the inactive state, the internal control signals 45, 46 and 47 are all at the low level so that the P-MOSs 78 and 79 turn OFF and the N-MOS 82 also turns OFF. Thus, the output terminal 4 is electrically separated from both the power source terminal 5 and the ground terminal 6 so as to be in a high impedance state. Also, since the P-MOSs 64 and 65 turn OFF, the current that flows to the bias section is cut off and, consequently, the operation of the differential amplifier stops and the current that flows to the P-MOS 73 is cut off. Further, as the N-MOS 80 turns OFF, the path of the current that flows from the power source terminal 5 to the ground terminal 6 through the P-MOS 77 and the N-MOS 76 is cut off. In this way, since all the current paths from the power source terminal 5 to the ground terminal 6 are cut off, the power consumption becomes almost zero.

Next, explanation is made on the operation of the operational amplifier 3000 before and after the change from the active state to the inactive state and from the inactive state to the active state. These changes are controlled by the control sequence section 100 as in the first embodiment. The values of the resistors 41–44 are set such that, when the control signal supplied to the control signal input terminal 1 changes from the high level to the low level, the inversions take place in the sequence of the input control signals 45, 46, 47 and, when the low level is inverted to the high level, the inversions take place in the sequence of the internal control signals 47, 46 and 45. The inverter 61 used is one whose inversion speed is sufficiently fast. Thus, when the operational amplifier changes from the inactive state to the active state, the internal control signals are inverted to the low levels in the sequence of the internal control signals 47, 46 and 45 so that the P-MOS 79 first turns OFF. At this moment, the differential amplifier is still operating and, since the voltage corresponding to the level of the input signal appears at the node 84, the N-MOS 82 becomes conductive accordingly and, therefore, the potential at the output terminal 4 becomes the ground potential. Thereafter, the N-MOS 82 turns OFF and, after the output terminal 4 turns to a high impedance state, the P-MOS 63 turns ON and thus the current that flows to the bias section is cut off. Inversely, when the operational amplifier 3000 changes from the inactive state to the active state, the inversions take place in the sequence of the internal control signals 45, 46 and 47 so that the current first flows to the bias section. Thus, since the voltage corresponding to the levels of the input signals appears at the node 84, the N-MOS 82 becomes conductive by the inversion to the high level that takes place in the next internal control signal 46, and the potential of the output terminal 4 becomes the ground potential. Thereafter, the internal control signal 47 is inverted to the high level and, since the P-MOS 79 becomes conductive, the output level of the output terminal becomes the level corresponding to the input signals.

In the operational amplifier according to the invention, since the control sequence section 100 controls the output terminal 4 such that the signal transiently outputted from the output terminal is caused to fall to the ground potential, the circuit connected at the next stage is unlikely to malfunction and, also since a single transistor is used to stop the operation of the bias section, there is no flow of the through-current when the change takes place both from the active state to the inactive state and from the inactive state to the active state, thus enabling the reduction of the power consumption.

In the above two embodiments of the invention, it has been arranged for the potential at the output terminal to fall to the ground potential in a transient period in both the cases when the change takes place from the active state to the inactive state and from the inactive state to the active state. However, this can of course be arranged such that, depending on the next circuit to be connected, the potential of the output terminal be caused to transiently rise to the power source potential.

Also, where there are a number of operational amplifiers, only one of such amplifiers may have the control sequence section 100 which commonly supplies the internal control signals 45, 46 and 47 to the other operational amplifiers, thereby reducing the number of the required elements to a minimum.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. An operational amplifier wherein input signals applied between inversion and non-inversion input terminals are differentially amplified and an output signal is outputted at an output terminal when a control signal applied to a control signal input terminal is at a first logical level and said output terminal is made to be in a high impedance state when said control signal is at a second logical level, said operational amplifier comprising:

a first and a second power source terminal;

a differential amplifier circuit having said inversion and non-inversion input terminals, for differentially amplifying said input signals and producing an internal differential signal;

a bias circuit for supplying a current to said differential amplifier;

an output circuit for procuring therein a first and a second internal output signal based on said internal differential signal produced by said differential amplifier circuit, said output circuit including a first output MOS transistor of a first conductivity type having a gate receiving said first internal output signal, a source connected to said first power source terminal and a drain connected to said output terminal, and a second output MOS transistor of a second conductivity type having a gate receiving said second internal output signal, a drain connected to said output terminal and a source connected to said second power source terminal; and a sequence control circuit including a first and a second inverting means for respectively producing, based on said control signal inputted to said control signal input terminal, a first internal control signal for on/off controlling said first output MOS transistor and a second internal control signal for on/off controlling said second output MOS transistor, said second internal control signal being inverted after said first internal control signal is inverted when said control signal changes from said first logical level to said second logical level, and said first internal control signal being inverted after said second control signal is inverted when said control signal changes from said second logical level to said first logical level.

2. An operational amplifier according to claim 1, in which:

said first inverting means of said sequence control circuit includes a first MOS transistor of said first conductivity type having a source connected to said first power source terminal, a gate connected to said control signal input terminal; a second MOS transistor of said second conductivity type having a source connected to said second power source terminal, a gate connected to said control signal input terminal; and a first resistor connected between drains of said first and second MOS transistors, said first internal control signal being outputted from the drain of said second MOS transistor, and said second inverting means of said sequence control circuit includes: a third MOS transistor of said first conductivity type having a source connected to said first power source terminal, a gate connected to said control signal input terminal; a fourth MOS transistor of said second conductivity type having a source connected to said second power source terminal, a gate connected to said control signal input terminal; a second and a third resistor connected in series between drains of said third and fourth MOS transistors, said second internal control signal being outputted from a junction node between said second and third resistors.

3. An operational amplifier according to claim 1, wherein said sequence control circuit further comprises a third inverting means for producing, based on said control signal inputted to said control signal input terminal, a third internal control signal for on/off controlling said bias circuit, said third internal control signal being inverted after said second internal control signal is inverted when said control signal changes from said first logical level to said second logical level, and said second internal control signal being inverted after said third control signal is inverted when said control signal changes from said second logical level to said first logical level.

4. An operational amplifier according to claim 3, in which said third inverting means of said sequence control circuit includes:

a first MOS transistor of said first conductivity type having a source connected to said first power source terminal, a gate connected to said control signal input terminal;

a second MOS transistor of said second conductivity type having a source connected to said second power source terminal, a gate connected to said control signal input terminal; and a resistor connected between drains of said first and second MOS transistors, said third internal control signal being outputted from the drain of said first MOS transistor.

5. An operational amplifier according to claim 1, wherein said first conductivity type is a P-channel type and said second conductivity is an N-channel type.

6. An operational amplifier according to claim 1, wherein a potential at said first power source terminal is higher than that at said second power source terminal.

* * * * *